(12) United States Patent
Huang et al.

(10) Patent No.: US 9,881,572 B2
(45) Date of Patent: Jan. 30, 2018

(54) SHIFT REGISTER CIRCUIT AND METHOD FOR DRIVING THE SAME, GATE DRIVING CIRCUIT, AND DISPLAY APPARATUS

(71) Applicants: BOE Technology Group Co., Ltd., Beijing (CN); Ordos Yuansheng Optoelectronics Co., Ltd., Inner Mongolia (CN)

(72) Inventors: Fei Huang, Beijing (CN); Jian Sun, Beijing (CN); Cheng Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 154 days.

(21) Appl. No.: 15/083,659

(22) Filed: Mar. 29, 2016

(65) Prior Publication Data

US 2017/0032752 A1 Feb. 2, 2017

(30) Foreign Application Priority Data

Jul. 29, 2015 (CN) .......................... 2015 1 0456612

(51) Int. Cl.
*G11C 19/00* (2006.01)
*G09G 3/36* (2006.01)
*G11C 19/28* (2006.01)
*G11C 19/18* (2006.01)

(52) U.S. Cl.
CPC ......... *G09G 3/3648* (2013.01); *G09G 3/3696* (2013.01); *G11C 19/184* (2013.01); *G11C 19/28* (2013.01); *G09G 3/3677* (2013.01); *G09G 2300/0819* (2013.01); *G09G 2300/0823* (2013.01); *G09G 2310/0251* (2013.01); *G09G 2310/0286* (2013.01); *G09G 2320/02* (2013.01)

(58) Field of Classification Search
None
See application file for complete search history.

(56) References Cited

U.S. PATENT DOCUMENTS

2011/0221736 A1* 9/2011 Pak ....................... G09G 3/3677
345/211
2011/0222645 A1* 9/2011 Tobita .................. G09G 3/3677
377/78

(Continued)

*Primary Examiner* — Tuan T Lam
(74) *Attorney, Agent, or Firm* — Westman, Champlin & Koehler, P.A.

(57) ABSTRACT

The present disclosure provides a shift register circuit and a method for driving the same, a gate driving circuit, and a display apparatus. The shift register circuit comprises an input module, configured to pull up a potential at a first node; an output module, configured to pull up a potential at an output when the potential at the first node is at a high level; a pull-up module, configured to periodically pull up a potential at the second node by using current from a high-level bias voltage line; a reset module, configured to pull down the potential at the first node under the control of a signal; and a pull-down module, configured to continuously pull down the potential at the second node before the potential at the first node is pulled down, and pull down potentials at the first node and the output when the potential at the second node is at a high level.

17 Claims, 5 Drawing Sheets

(56) References Cited

U.S. PATENT DOCUMENTS

| | | | | |
|---|---|---|---|---|
| 2011/0228893 | A1* | 9/2011 | Tobita | G11C 19/184 377/77 |
| 2013/0169319 | A1* | 7/2013 | Sasaki | G09G 3/3677 327/108 |
| 2014/0119493 | A1* | 5/2014 | Yang | G11C 19/28 377/64 |
| 2014/0168050 | A1* | 6/2014 | Gu | G09G 3/3611 345/100 |
| 2016/0253976 | A1* | 9/2016 | Jang | G09G 3/3677 345/208 |
| 2016/0322115 | A1* | 11/2016 | Xu | G11C 19/28 |
| 2016/0351156 | A1* | 12/2016 | Wu | G11C 19/28 |
| 2017/0061913 | A1* | 3/2017 | Wang | G09G 3/36 |

* cited by examiner

SHIFT REGISTER CIRCUIT AND METHOD FOR DRIVING THE SAME, GATE DRIVING CIRCUIT, AND DISPLAY APPARATUS

CROSS-REFERENCE TO RELATED APPLICATION(S)

This application claims priority to the Chinese Patent Application No. 201510456612.6, filed on Jul. 29, 2015, entitled "SHIFT REGISTER CIRCUIT AND METHOD FOR DRIVING THE SAME, GATE DRIVING CIRCUIT, AND DISPLAY APPARATUS" which is incorporated herein by reference in its entirety.

TECHNICAL FIELD

The present disclosure relates to a technical field of display, and more particularly, to a shift register circuit and a method for driving the same, a gate driving circuit, and a display apparatus.

BACKGROUND

Gate Drive on Array (GOA) technology not only achieves an aesthetic design of a display panel with symmetric sides, but also omits a binding area for a chip and a wiring region such as a fan-out area, which is beneficial to achieve a design of a narrow bezel. Further, due to omission of a chip binding process in a row direction, it is also advantageous to improve the whole production capacity and yield rate.

Currently, GOA circuits mostly use Thin Film Transistors (TFTs) as basic switching elements, which can be produced by using the same process as that of pixel circuits in a display area, thereby significantly reducing the cost. However, TFT devices may have large leakage current in a switch-off state due to manufacturing processes, which easily results in mutual interference between signals and thus generates noise voltages. The noise voltages not only influence stability of an output signal and cause an error output, but also result in an additional power consumption and influence product performance.

SUMMARY

Embodiments of the present disclosure provide a shift register circuit and a method for driving the same, a gate driving circuit, and a display apparatus.

According to a first aspect, the embodiments of the present disclosure provide a shift register circuit including an input, a reset end and an output, further comprising:

an input module connected to a first node, a second node, and the input, configured to pull up a potential at the first node under the control of a signal at the input while releasing a noise voltage at the second node;

an output module connected to the first node and the output, configured to pull up a potential at the output when the potential at the first node is at a high level;

a pull-up module connected to the second node, configured to periodically pull up a potential at the second node by using current from a high-level bias voltage line under the control of a lock signal;

a reset module connected to the first node, the second node and the reset end, configured to pull down the potential at the first node under the control of a signal at the reset end while releasing a noise voltage at the second node; and a pull-down module connected to the first node, the second node and the output, configured to continuously pull down the potential at the second node before the potential at the first node is pulled down, and pull down potentials at the first node and the output when the potential at the second node is at a high level.

Alternatively, the input module comprises a first transistor and a second transistor, wherein, the first transistor has a gate connected to the input, one of a source and a drain connected to the input or a first bias voltage line, and the other of the source and the drain connected to the first node; and the second transistor has a gate connected to the input, one of a source and a drain connected to the second node, and the other of the source and the drain connected to a low-level bias voltage line.

Alternatively, the reset module comprises a third transistor and a fourth transistor, wherein, the third transistor has a gate connected to the reset end, one of a source and a drain connected to the reset end or a second bias voltage line, and the other of the source and the drain connected to the first node; and the fourth transistor has a gate connected to the reset end, one of a source and a drain connected to the second node, and the other of the source and the drain connected to a low-level bias voltage line.

Alternatively, the output module comprises a first capacitance and a fifth transistor, wherein, the fifth transistor has a gate connected to the first node, one of a source and a drain connected to a first clock signal line, and the other of the source and the drain connected to the output; and the first capacitance has a first end connected to the first node and a second end connected to the output.

Alternatively, the first capacitance is formed of a gate metal layer and a source/drain metal layer which are overlapped with each other in the fifth transistor.

Alternatively, the pull-up module comprises a sixth transistor and a seventh transistor, wherein, the sixth transistor has a gate connected to the high-level bias voltage line, one of a source and a drain connected to a second clock signal line, and the other of the source and the drain connected to a gate of the seventh transistor; and the seventh transistor has one of a source and a drain connected to the high-level bias voltage line, and the other of the source and the drain connected to the second node.

Alternatively, the pull-up module comprises an eighth transistor, a ninth transistor, and a tenth transistor, wherein, the eighth transistor has a gate connected to a second clock signal line, one of a source and a drain connected to a first bias voltage line, and the other of the source and the drain connected to a gate of the tenth transistor;

the ninth transistor has a gate connected to a third clock signal line, one of a source and a drain connected to the gate of the tenth transistor, and the other of the source and the drain connected to a second bias voltage line; and the tenth transistor has one of a source and a drain connected to the high-level bias voltage line, and the other of the source and the drain connected to the second node.

Alternatively, the pull-up module further comprises an eleventh transistor connected between the tenth transistor and the second node, wherein the eleventh transistor has a gate connected to the high-level bias voltage line, one of a source and a drain connected to the tenth transistor, and the other of the source and the drain connected to the second node.

Alternatively, the pull-down module comprises a second capacitance, a twelfth transistor, a thirteenth transistor, and a fourteenth transistor, wherein, the second capacitance has a first end connected to the second node, and a second end connected to a low-level bias voltage line;

the twelfth transistor has a gate connected to the second node, one of a source and a drain connected to the first node, and the other of the source and the drain connected to the low-level bias voltage line;

the thirteenth transistor has a gate connected to the second node, one of a source and a drain connected to the output, and the other of the source and the drain connected to the low-level bias voltage line; and the fourteenth transistor has a gate connected to the output, one of a source and a drain connected to the second node, and the other of the source and the drain connected to the low-level bias voltage line.

Alternatively, the pull-down module further comprises a fifteenth transistor, wherein the fifteenth transistor has a gate connected to the first node, one of a source and a drain connected to the second node, and the other of the source and the drain connected to the low-level bias voltage line.

Alternatively, the shift register circuit further comprises:

an isolation module between the input module and the first node and between the reset module and the first node, configured to isolate a noise voltage between the input and the first node and a noise voltage between the reset end and the first node.

Alternatively, the isolation module comprises a sixteenth transistor, wherein the sixteenth transistor has a gate connected to the high-level bias voltage line, one of a source and a drain connected to the input module and the reset module, and the other of the source and the drain connected to the first node.

Alternatively, the shift register circuit further comprises:

a voltage stabilization module connected to the output, configured to stabilize the potential at the output by using current from the high-level bias voltage line after the potential at the output is pulled up.

Alternatively, the voltage stabilization module comprises a seventeenth transistor, wherein the seventeenth transistor has a gate connected to the output, one of a source and a drain connected to the high-level bias voltage line, and the other of the source and the drain connected to the output.

According to a second aspect, the embodiments of the present disclosure further provide a method for driving any shift register circuit described above, comprising:

applying an input signal to the input in a first stage to enable the input module to pull up the potential at the first node and release the noise voltage at the second node, and enable the output module to pull up the potential at the output in a second stage in which the potential at the first node is at a high level; and applying a reset signal to the reset end in a third stage to enable the reset module to pull down the potential at the first node while releasing the noise voltage at the second node, and enable the pull-down module to pull down the potentials at the first node and the output when the potential at the second node is at a high level;

wherein the potential at the second node is periodically pulled up by the pull-up module by using the current from the high-level bias voltage line under the control of a clock signal; and the potential at the second node is pulled down continuously by the pull-down module before the potential at the first node is pulled down, to enable the potential at the second node to be maintained at a low level before the potential at the first node is pulled down.

According to a third aspect, the embodiments of the present disclosure further provide a gate driving circuit, comprising multiple shift register units each having a circuit structure of any shift register circuit described above.

According to a fourth aspect, the embodiments of the present disclosure further provide a display apparatus, comprising any gate driving circuit described above.

BRIEF DESCRIPTION OF THE DRAWINGS

In order to illustrate technical solutions in the embodiments of the present disclosure more clearly, accompanying drawings needed to be used in the description of the embodiments will be described below in brief. Obviously, the accompanying drawings described below are merely some examples of the present disclosure. Those skilled persons in the art can further obtain other drawings according to the accompanying drawing without contributing any creative labor, in which.

DETAILED DESCRIPTION

In order to make the purpose, technical solutions, and advantages of the embodiments of the present disclosure more clearly, the technical solutions in the embodiments of the present disclosure will be clearly and completely described below with reference to the drawings of the embodiments of the present disclosure. Obviously, the embodiments as described are merely a part of embodiments of the present disclosure instead of all the embodiments. All other embodiments obtained by those skilled persons in the art without contributing any creative labor should belong to the scope protected by the present disclosure.

Figure 1:
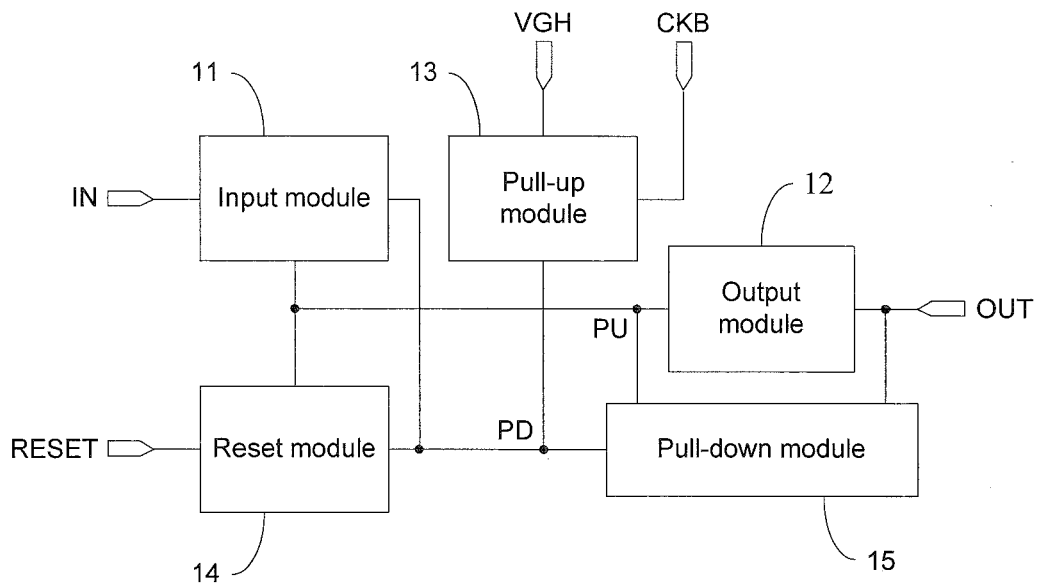
FIG. 1 is a structural block diagram of a shift register circuit according to an embodiment of the present disclosure.

FIG. 1 is a structural block diagram of a shift register circuit according to an embodiment of the present disclosure. As shown in FIG. 1, the shift register circuit comprises an input IN, a reset end RESET, and an output OUT, wherein the input IN and the reset end RESET are signal inputs, and the output OUT is a signal output. Further, the shift register circuit may further comprise:

an input module 11 connected to a first node PU, a second node PD, and the input IN, configured to pull up a potential at the first node PU under the control of a signal at the input IN, while releasing a noise voltage at the second node PD;

an output module 12 connected to the first node PU and the output OUT, configured to pull up a potential at the output OUT when the potential at the first node PU is at a high level;

a pull-up module 13 connected to the second node PD, configured to periodically pull up a potential at the second node PD by using current from a high-level bias voltage line VGH under the control of a lock signal from a second clock signal line CKB;

a reset module 14 connected to the first node PU, the second node PD and the reset end RESET, configured to pull down the potential at the first node PU under the control of a signal at the reset end RESET while releasing the noise voltage at the second node PD; and a pull-down module 15 connected to the first node PU, the second node PD and the output OUT, configured to continuously pull down the potential at the second node PD before the potential at the first node PU is pulled down, and pull down potentials at the first node PU and the output OUT when the potential at the second node PD is at a high level.

It should be understood that "high level" and "low level" mentioned herein refer to two preset potentials, one of which has higher or lower amplitude than that of the other. The two potentials may be set by those skilled in the art according to selected devices and adopted circuit structures, which is not limited in the present disclosure.

Figure 2:
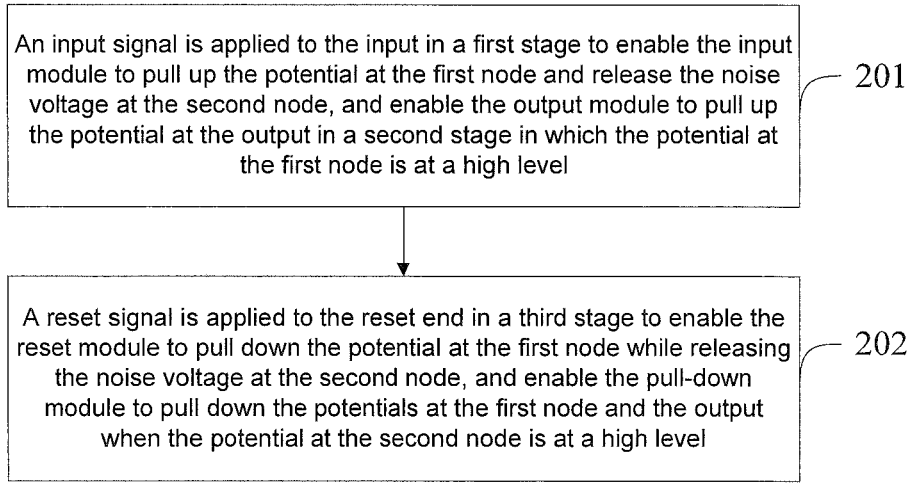
FIG. 2 is a flowchart of a method for driving a shift register circuit according to an embodiment of the present disclosure.

In order to illustrate the structures and functions of the various modules mentioned above more clearly, the operational principle and driving manner of the shift register circuit will be described below. FIG. 2 is a flowchart of a method for driving a shift register circuit according to an embodiment of the present disclosure. As shown in FIG. 2, the method comprises the following steps.

In step 201, an input signal is applied to the input in a first stage to enable the input module to pull up the potential at the first node and release the noise voltage at the second node, and enable the output module to pull up the potential at the output in a second stage in which the potential at the first node is at a high level.

In step 202, a reset signal is applied to the reset end in a third stage to enable the reset module to pull down the potential at the first node while releasing the noise voltage at the second node, and enable the pull-down module to pull down the potentials at the first node and the output when the potential at the second node is at a high level.

The potential at the second node is periodically pulled up by the pull-up module by using the current from the high-level bias voltage line under the control of the clock signal; and the potential at the second node is pulled down continuously by the pull-down module before the potential at the first node is pulled down, to enable the potential at the second node to be maintained at a low level before the potential at the first node is pulled down.

The present disclosure will be described in detail below in conjunction with FIGS. 1 and 2.

In an initial state, potentials at the first node PU and the output OUT are at a low level, and the potential at the second node PD is continuously pulled down by the pull-down module 15, which may cause current provided by the pull-up module 13 to the second node PD to flow out, to enable the potential at the second node PD to be maintained at a low level as well.

In a first stage in which an input signal is applied to the input IN, a signal at the input IN is at an effective level, and the input module 11 pulls up the potential at the first node PU while releasing a noise voltage at the second node PD. In this case, the potential at the first node PU becomes a high level, and the potential at the second node PD is still maintained at a low level. Then, in a second stage, the potential at the output OUT may be pulled up by the output module 12 under the function of the high level at the first node PU, to enable the signal output by the output to become a high level.

Next, in a third stage in which a reset signal is applied to the reset end RESET, a signal at the reset end RESET is at an effective level, and the reset module 14 may pull down the potential at the first node PU while releasing the noise voltage at the second node PD. In this case, the potential at the second node PD is no longer continuously pulled down by the pull-down module 15, to enable the potential at the second node PD to be pulled up to a high level under the function of the pull-up module 13. Thereby, the pull-down module 15 may pull down the potential at the output OUT when the potential at the second node PD is at a high level, and pull down the potential at the first node PU in cooperation with the reset module 14. As a result, the potential at the first node PU is at a low level, the signal output by the output OUT is at a low level, the potential at the second node PD may always be maintained at a high level, and the potentials at the first node PU and the output OUT are maintained at a low level.

It can be understood that the various modules described above may be implemented by a circuit including an electrically controlled switching element. The electrically controlled switching element may be any electronic device which is controlled by an electrical signal to achieve a voltage change between two nodes of the circuit.

It can be seen that the embodiments of the present disclosure can reduce the influence of the signals at the input IN and the reset end RESET to the potential at the second node PD based on the arrangements of the input module 11 and the reset module 14 described above, and can isolate the clock signal from the first node PU based on the arrangement of the pull-up module 13 described above, thereby avoiding mutual interference. Therefore, the embodiments of the present disclosure can suppress the noise voltage in the circuit and reduce the influence of the noise voltage to the stability of the signal, which is not only beneficial to improve a signal-to-noise ratio of the output signal, but also is beneficial to reduce power consumption of the circuit, thereby improving product performance.

Figure 3:
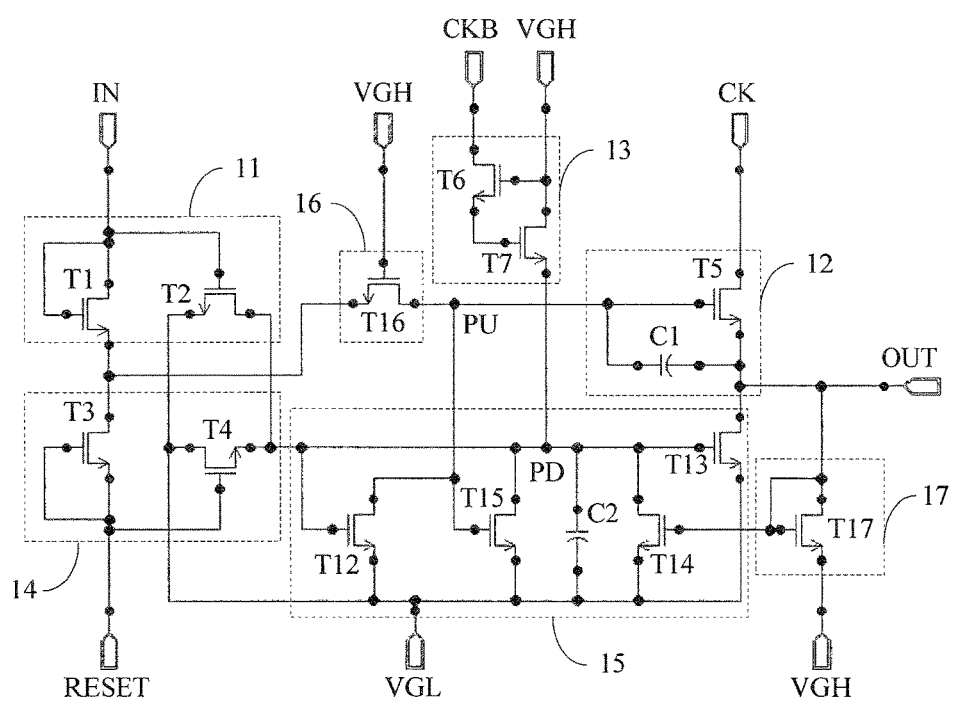
FIG. 3 is a structural diagram of a shift register circuit according to an embodiment of the present disclosure.

As a more specific example, FIG. 3 is a structural diagram of a shift register circuit according to an embodiment of the present disclosure.

As shown in FIG. 3, the input module 11 comprises a first transistor T1 and a second transistor T2, wherein, the first transistor T1 has a gate and a drain connected to the input IN, and a source indirectly connected to the first node PU; and the second transistor T2 has a gate connected to the input IN, a drain connected to the second node PD, and a source connected to a low-level bias voltage line VGL. Thereby, when the signal at the input IN is at a high level, current flowing towards the first node PU may be generated in the first transistor T1 to pull up the potential at the first node PU. At the same time, as the second node PD and the low-level bias voltage line VGL are conducted by the second transistor T2, the noise voltage at the second node PD may be released.

In the embodiment of the present disclosure, the reset module 14 described above comprises a third transistor T3 and a fourth transistor T4, wherein, the third transistor T3 has a gate and a source connected to the reset end RESET, and a drain indirectly connected to the first node PU; and the fourth transistor T4 has a gate connected to the reset end RESET as well, a source connected to the second node PD, and a drain connected to the low-level bias voltage line VGL. Thereby, when the signal at the reset end RESET is at a low level, current flowing from the first node PU towards the reset end RESET may be generated in the third transistor T3 to pull down the potential at the first node PU. At the same time, as the second node PD and the low-level bias voltage line VGL are conducted by the fourth transistor T4, the noise voltage at the second node PD may be released.

In the embodiment of the present disclosure, the output module 12 described above comprises a first capacitance C1 and a fifth transistor T5, wherein, the fifth transistor T5 has a gate connected to the first node PU, a drain connected to a first clock signal line CK, and a source connected to the output OUT; and the first capacitance C1 has a first end connected to the first node PU and a second end connected to the output OUT. Thereby, when the potential at the first node PU is at a high level and an amount of charges are stored in the first capacitance C1 in a case that there is a potential difference across the first capacitance C1, a potential on the first clock signal line CK becomes a high level from a low level, which enables the potential at the output OUT to be pulled up by the current from the first clock signal line CK, and the potential at the first node PU is further increased under the function of the first capacitance C1, thereby accelerating pull-up of the potential at the output OUT.

In the embodiment of the present disclosure, the pull-up module 13 described above comprises a sixth transistor T6 and a seventh transistor T7, wherein, the sixth transistor T6 has a gate connected to the high-level bias voltage line VGH, a drain connected to a second clock signal line CKB, and a source connected to a gate of the seventh transistor T7; and the seventh transistor T7 has a drain connected to the high-level bias voltage line VGH, and a source connected to the second node PD. Thereby, when a potential on the second clock signal line CKB is at a high level, the sixth transistor T6 is switched on and enables a potential at the gate of the seventh transistor T7 to become a high level. In this case, the potential at the second node PD may be pulled up by the current from the high-level bias voltage line VGH. It should be understood that there may be two clock signals with opposite phases on the first clock signal line CK and the second clock signal line CKB. Therefore, the process of pulling up the potential at the second node PD is implemented periodically. It can be seen that based on the structures of the sixth transistor T6 and the seventh transistor T7, there may be no current generated between the second node PD and the second clock signal line CKB, thereby avoiding the interference of the clock signal to the potential at the second node PD.

In the embodiment of the present disclosure, the pull-up module 15 described above comprises a second capacitance C2, a twelfth transistor T12, a thirteenth transistor T13, a fourteenth transistor T14 and a fifteenth transistor T15. The second capacitance C2 has a first end connected to the second node PD, and a second end connected to the low-level bias voltage line VGL. The twelfth transistor T12 has a gate connected to the second node PD, a drain connected to the first node PU, and a source connected to the low-level bias voltage line VGL. The thirteenth transistor T13 has a gate connected to the second node PD, a drain connected to the output OUT, and a source connected to the low-level bias voltage line VGL. The fourteenth transistor T14 has a gate connected to the output OUT, a drain connected to the second node PD, and a source connected to the low-level bias voltage line VGL. The fifteenth transistor T15 has a gate connected to the first node PU, a drain connected to the second node PD, and a source connected to the low-level bias voltage line VGL. Thereby, before the potentials at the first node PU and the output OUT are pulled down, the fourteenth transistor T14 and the fifteenth transistor T15 are switched on to enable the potential at the second node PD to be continuously pulled down. After the potential at the first node PU is pulled down by the reset module 14, the potential at the second node PD may be pulled up to a high level under the function of the pull-up module 13. In this case, the twelfth transistor T12 and the thirteenth transistor T13 are switched on, and the potentials at the first node PU and the output OUT are pulled down to a low level. Further, the second capacitance C2 may stabilize the potential at the second node PD and reduce the noise at the second node PD.

In the embodiment of the present disclosure, the shift register circuit further comprises an isolation module 16 between the input module 11 and the first node PU and between the reset module 14 and the first node PU. The isolation module 16 is configured to isolate a noise voltage between the input IN and the first node PU and a noise voltage between the reset end RESET and the first node PU. Specifically, in the embodiment of the present disclosure, the isolation module comprises a sixteenth transistor T16, wherein the sixteenth transistor T16 has a gate connected to the high-level bias voltage line VGH, a source connected to the input module 11 and the reset module 14, and a drain connected to the first node PU. Thereby, the sixteenth transistor T16 which is in a switch-on state all the time may suppress the noise voltages from the input module 11 and the reset module 14 to some extent, so as to maintain the stability of the potential at the first node PU. Of course, in other embodiments of the present disclosure, the isolation module 16 may also be in other similar structures.

In the embodiment of the present disclosure, the shift register circuit further comprises a voltage stabilization module 17 connected to the output OUT. The voltage stabilization module 17 is configured to stabilize the potential at the output OUT using current from the high-level bias voltage line VGH after the potential at the output OUT is pulled up. Specifically, the voltage stabilization module 17 in FIG. 3 comprises a seventeenth transistor T17, wherein the seventeenth transistor T17 has a gate and a drain connected to the output OUT, and a source connected to the high-level bias voltage line VGH. Thereby, when the potential at the output OUT is at a high level, the potential at the output OUT may be stabilized by the seventeenth transistor T17 by using the current from the high-level bias voltage line VGH. Of course, in other embodiments of the present disclosure, the voltage stabilization module 17 may also be in other similar structures.

It should be noted that in other embodiments of the present disclosure, a connection relationship between a source and a drain of any transistor described above may be opposite to that illustrated in FIG. 3, depending on a specific type of the transistor. In particular, when a source and a drain in a transistor are symmetric, the source and the drain of the transistor may be regarded as two electrodes without any special differentiation.

Figure 4:
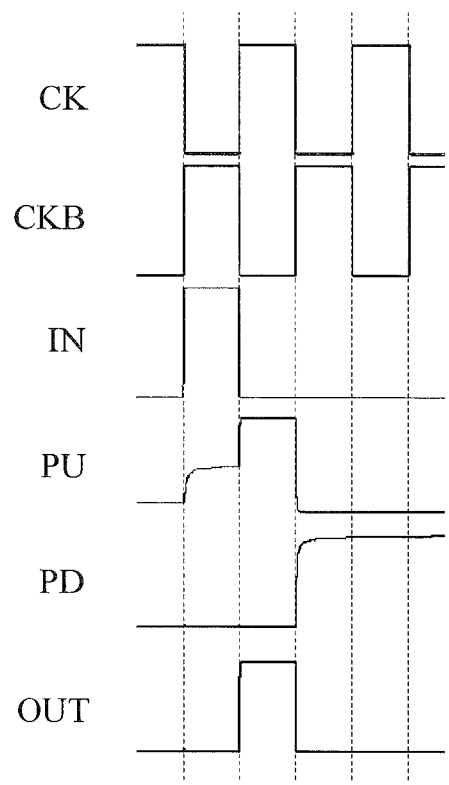
FIG. 4 is a timing diagram of simulation of the shift register circuit illustrated in FIG. 3.

Based on the structure of the circuit illustrated in FIG. 3, FIG. 4 illustrates a timing diagram of simulation of the shift register circuit illustrated in FIG. 3. It should be noted that the signal at the reset end RESET is not illustrated in FIG. 4. It should be understood that the timing of the circuit illustrated in FIG. 4 is in accordance with the structures and functions of various modules in FIG. 3 as well as the operational principle of the shift register circuit illustrated in FIG. 1, which will not be described here in detail. It can be seen from FIG. 4 that the potentials at the first node PU, the second node PD and the output OUT have high stability without any obvious noise voltage.

Figure 5:
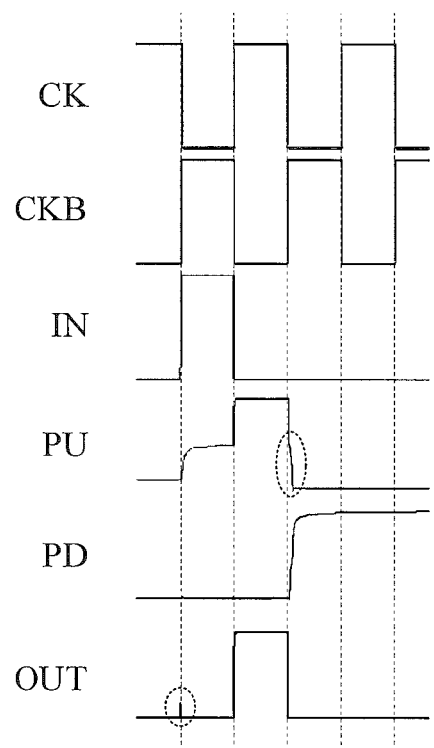
FIG. 5 is a timing diagram of simulation of a comparable shift register circuit.

As a comparison, FIG. 5 illustrates a timing diagram of simulation of a comparable shift register circuit. Compared with the structure of the circuit illustrated in FIG. 3, in the comparable shift register circuit, the second transistor T2, the fourth transistor T4, the sixteenth transistor T16 and the seventeenth transistor T17 are removed, and the sixth transistor T6 and the seventh transistor T7 are substituted for a transistor having a drain and a gate connected to the second clock signal line CKB and a source connected to the second node PD (not shown). It can be seen from the comparison between FIG. 5 and FIG. 4 that there is a noise voltage in a position denoted by a dotted circle in the timing of the circuit illustrated in FIG. 5. Correspondingly, there is no noise voltage which is the same as or similar to the above noise voltage in a corresponding position in FIG. 4. Thus, the shift register circuit illustrated in FIG. 3 can reduce the signal noise well.

Figure 6:
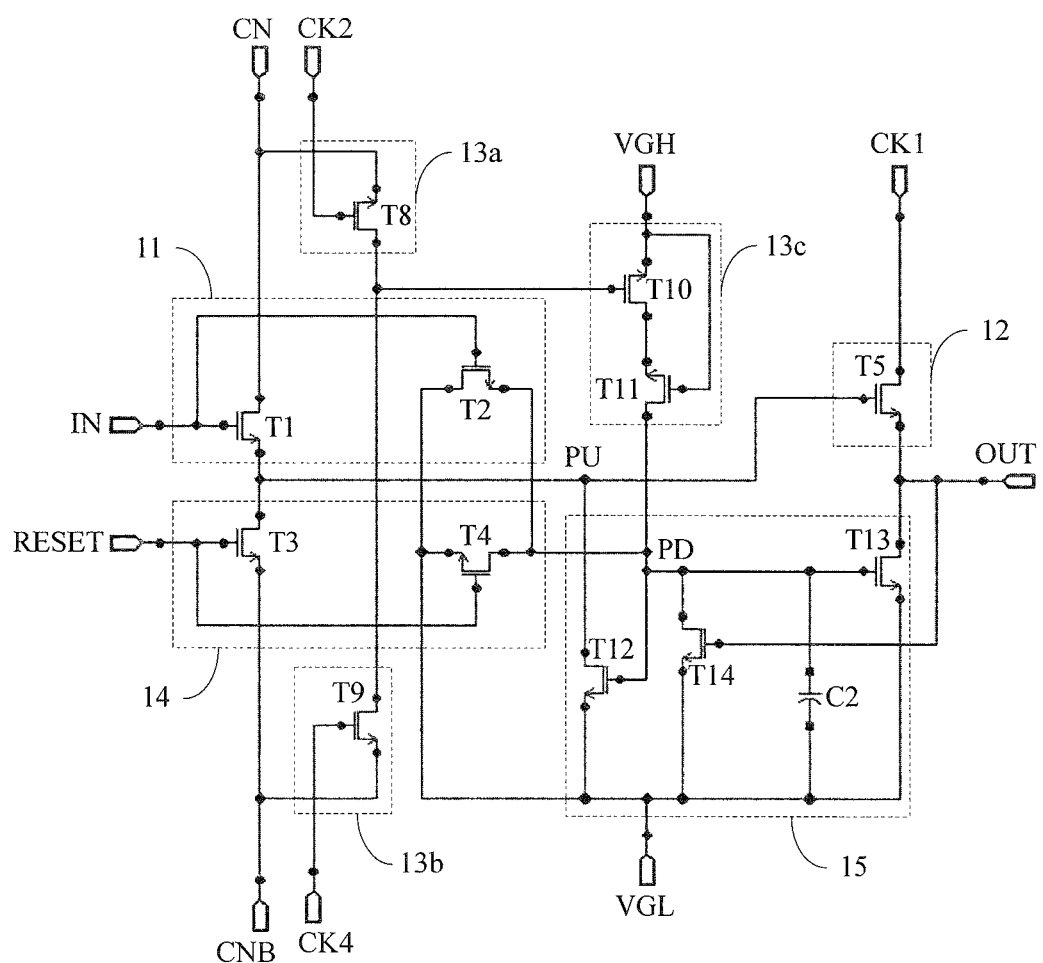
FIG. 6 is a structural diagram of a shift register circuit according to another embodiment of the present disclosure.

As another more specific example, FIG. 6 is a structural diagram of a shift register circuit according to another embodiment of the present disclosure. It should be noted that compared with the first clock signal line CK and the second clock signal line CKB connected to the shift register circuit in FIG. 3, clock signal lines connected to the shift register circuit in FIG. 6 comprises a first clock signal line CK1, a second clock signal line CK2, a fourth clock signal line CK3 and a third clock signal line CK4. It can be seen that the shift register circuit in FIG. 3 and the shift register circuit in FIG. 6 may be regarded as examples of structures of two circuits in a case of two clock signals with different phases and in a case of four clock signals with different phases respectively.

As shown in FIG. 6, in the embodiment of the present disclosure, an input module 11 comprises a first transistor T1, wherein the first transistor T1 has a gate connected to an input IN, a drain connected to a first bias voltage line CN, and a source connected to a first node PU; and a reset module 14 comprises a third transistor T3, wherein the third transistor T3 has a gate connected to a reset end RESET, a source connected to a second bias voltage line CNB, and a drain connected to the first node PU. It should be noted that the first bias voltage line CN and the second bias voltage line CNB are bias voltage lines with a preset level, and are loaded with a high level voltage and a low level voltage respectively in the embodiment of the present disclosure. Thereby, the input module 11 may pull up a potential at the first node PU by using current from the first bias voltage line CN when a potential at the input IN is at a high level, and the reset module 14 may pull down the potential at the first node PU by using current flowing towards the second bias voltage line CNB when a potential at the reset end RESET is at a high level. In addition, the shift register circuit according to the embodiment of the present disclosure has the same second transistor T2 and fourth transistor T4 as those in the shift register circuit illustrated in FIG. 3, and thus has the same functions and effects as those of the circuit illustrated in FIG. 6, which will not be described here in detail.

In the output module 12 illustrated in FIG. 6, the fifth transistor T5 has a gate connected to the first node PU, a drain connected to the first clock signal line CK1, and a source connected to the output OUT. Compared with the output module 12 illustrated in FIG. 3, the first capacitance C1 according to the embodiment of the present disclosure differs in that it is no longer implemented as an independent device, and instead, is formed of a gate metal layer and a source/drain metal layer which are overlapped with each other in the fifth transistor T5. Thereby, not only a layout space of the circuit can be saved, but also the power consumption of the shift register circuit can be significantly reduced.

Compared with the pull-down module 15 illustrated in FIG. 3, the pull-down module 15 illustrated in FIG. 6 does not comprise the fifteenth transistor T15 illustrated in FIG. 3, and the fourteenth transistor T14 is modified to be switched on when the gate is at a low level. Therefore, the potential at the second node PD may also be continuously pulled down before the potential at the first node PU is pulled down. It can be understood that the fifteenth transistor T15, which may continuously pull down the potential at the second node PD before the potential at the output OUT is pulled down, is not a necessary structure for the pull-down module 15.

In the shift register circuit illustrated in FIG. 6, the pull-up module 13 comprises a first sub-module 13a, a second sub-module 13b, and a third sub-module 13c, wherein, the first sub-module 13a comprises an eighth transistor T8, wherein the eighth transistor T8 has a gate connected to the second clock signal line CK2, a source connected to the first bias voltage line CN, and a drain connected to a gate of a tenth transistor T10;

the second sub-module 13b comprises a ninth transistor T9, wherein the ninth transistor T9 has a gate connected to the third clock signal line CK4, a source connected to the second bias voltage line CNB, and a drain connected to a gate of the tenth transistor T10; and the third sub-module 13c comprises the tenth transistor T10 and an eleventh transistor T11, wherein the tenth transistor T10 has a source connected to the high-level bias voltage line VGH, and a drain indirectly connected to the second node PD; and the eleventh transistor T11 is connected between the tenth transistor T10 and the second node PD, and has a gate connected to the high-level bias voltage line VGH, a source connected to the tenth transistor T10, and a drain connected to the second node PD.

Figure 7:
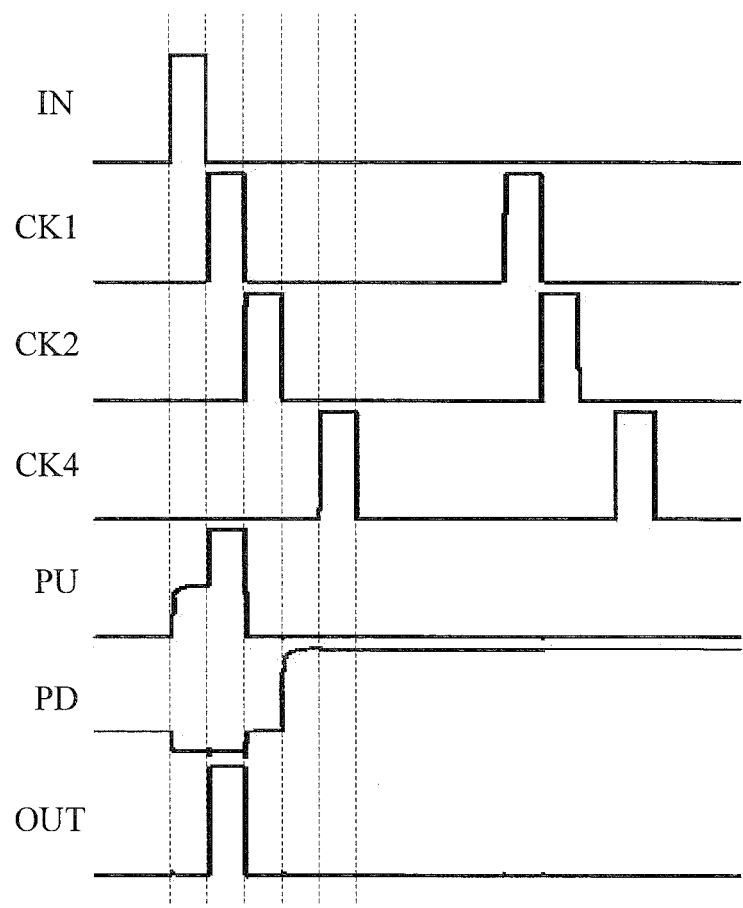
FIG. 7 is a timing diagram of simulation of the shift register circuit illustrated in FIG. 6.

FIG. 7 is a timing diagram of simulation of the shift register circuit illustrated in FIG. 6. As shown in FIG. 7, clock signals for the shift register circuit are four clock signals with the same period and sequential lagging phases, and clock signal lines comprise a first clock signal line CK1, a second clock signal line CK2, a fourth clock signal line CK3 (not shown) and a third clock signal line CK4 in a sequential order of phases. Compared with the clock signals in the shift register circuits illustrated in FIGS. 1 and 3, the clock signals used by the pull-up module 13 comprises signals on the second clock signal line CK2 and the third clock signal line CK4. It can be understood that the eighth transistor T8 and the ninth transistor T9 are used to provide a periodic signal for controlling pull-up of the potential at the second node PD. Specifically, after the eighth transistor T8 is switched on under the function of the clock signal on the second clock signal line CK2, a potential at the gate of the tenth transistor T10 is pulled up by current from the first bias voltage line CN, and thereby the potential at the second node PD may be pulled up by current from the high-level bias voltage line VGH. After the ninth transistor T9 is switched on under the function of the clock signal on the third clock signal line CK4, the potential at the gate of the tenth transistor T10 is pulled down by current flowing towards the second bias voltage line CNB, and thereby the tenth transistor T10 is switched off, and the pull-up module 13 stops pulling up the potential at the second node PD. In this way, the periodic signal for controlling pull-up of the potential at the second node PD may be formed.

It can be understood that the eleventh transistor T11 is a transistor which is always in a switch-on state, and therefore can isolate mutual interference between signals at the source and the drain. However, the eleventh transistor T11 is not necessary for the pull-up module 13 to achieve periodic pull-up of the potential at the second node PD. Therefore, in other embodiments of the present disclosure, the pull-up module 13 may only comprise the eighth transistor T8, the ninth transistor T9 and the tenth transistor T10, instead of the eleventh transistor T11.

Further, although not shown, the circuit illustrated in FIG. 6 may also comprise the isolation module 16 and/or the voltage stabilization module 17. Both the isolation module 16 and the voltage stabilization module 17 may be arranged in a manner which is the same as or similar to that in FIG. 3, and can play the same or similar role in the circuit as that in FIG. 3, which will not be described here in detail.

As shown in FIG. 7, in the embodiment of the present disclosure, the fourteenth transistor T14, the tenth transistor T10 and the eleventh transistor T11 have channel width-to-length ratios which correspond to each other. Therefore, the pull-down function of the pull-down module 15 and the periodic pull-up function of the pull-up module 13 cancel each other to some extent. In this case, in a normal state, the potential at the second node PD is slightly higher than the potential on the low-level bias voltage line VGL. Besides, the timing of the circuit according to the embodiment of the present disclosure is in accordance with the structures and functions of various modules in FIG. 6 as well as the operational principle of the shift register circuit illustrated in FIG. 1, which will not be described here in detail. It can be seen from FIG. 4 that the potentials at the first node PU, the second node PD and the output OUT have high stability without any obvious noise voltage.

It should be noted that in other embodiments of the present disclosure, a connection relationship between a source and a drain of any transistor described above may be opposite to that illustrated in FIG. 6, depending on a specific type of the transistor. In particular, when a source and a drain in a transistor are symmetric, the source and the drain of the transistor may be regarded as two electrodes without any special differentiation.

Based on the same inventive concept, the embodiments of the present disclosure provide a gate driving circuit, comprising multiple shift register units each having the structure of any shift register circuit described above. In an embodiment of the present disclosure, the multiple shift register units may be connected in the following manner: except for the first shift register unit, an input of any shift register unit is connected to an output of a previous shift register unit; and except for the first shift register unit, an output of any shift register unit is connected to a reset end of a previous shift register unit.

It can be seen that the embodiments of the present disclosure can reduce the influence of the signals at the input and the reset end to the potential at the second node based on the arrangements of input module and the reset module, and can isolate the clock signal from the first node based on the arrangement of the pull-up module, thereby avoiding mutual interference. Therefore, the embodiments of the present disclosure can suppress the noise voltage in the circuit and reduce the influence of the noise voltage to the stability of the signal, which is not only beneficial to improve a signal-to-noise ratio of the output signal, but also is beneficial to reduce power consumption of the circuit, thereby improving product performance.

Based on the same inventive concept, the embodiments of the present disclosure provide a display apparatus comprising any gate driving circuit described above. It should be noted that the display apparatus in the embodiments may be any product or component having a display function such as a display panel, an electronic paper, a mobile phone, a tablet computer, a television, a notebook computer, a digital photo frame, a navigator or the like.

It should be illustrated in the description of the present disclosure that an orientation or position relation indicated by terms such as "up", "down" or the like is an orientation or position relation indicated in the accompanying drawings, and is merely used to conveniently describe the present disclosure and simplify the description, instead of indicating or implying that the indicated apparatus or element must have a particular orientation and must be constructed and operated in a particular orientation, and thus cannot be construed as limiting the present disclosure. Unless otherwise explicitly specified or defined, terms such as "be installed in", "be connected with", "be connected to" or the like should be construed in a generalized sense. For example, these terms may refer to "be fixedly connected to", "be detachably connected to", or "be integrally connected to"; or may be "be mechanically connected to", or "be electrically connected to"; or may be "be directly connected to" or "be indirectly connected through an intermediate medium", or may be "connectivity in two elements". Specific meanings of the terms described above in the present disclosure can be understood by those skilled in the art according to specific conditions.

A number of specific details have been described in the specification of the present disclosure. However, it should be understood that the embodiments of the present disclosure may be practiced without these specific details. In some instances, well-known methods, structures and technologies have not been described in detail to avoid obscuring the specification.

Similarly, it should be understood that in order to simplify the present disclosure and facilitate understanding of one or more of various aspects of the present disclosure, in the description of the exemplary embodiments of the present disclosure described above, various features of the present disclosure sometimes are grouped into a single embodiment, figure or description thereof. However, the method according to the present disclosure should not be construed as reflecting that the present disclosure to be protected claims more features than those explicitly recited in each claim. Rather, as described in the claims, an aspect of the present disclosure comprises less features than all features in the single embodiment disclosed above. Therefore, the claims which follow the detailed description are explicitly hereby incorporated into the detailed description, and each claim per se is used as a separate embodiment of the present disclosure.

It should be noted that the embodiments described above are used to describe the present disclosure instead of limiting the present disclosure, and substitutive embodiments can be envisaged by those skilled in the art without departing from the scope of the appended claims. In the claims, no reference sign in parentheses should be construed as limiting the claims. A word "include" does not exclude elements or steps which are not listed in the claims. A word "one" or "an" before an element does not exclude multiple such elements. The present disclosure may be implemented by means of hardware including several distinct elements, and by means of a suitably programmed computer. In a unit claim enumerating a number of apparatuses, several of these apparatuses may be embodied by the same hardware item. Words "first", "second", "third" or the like are used without limiting an order. These words may be construed as names.

Finally, it should be illustrated that the various embodiments described above are merely used to illustrate the technical solutions of the present disclosure, instead of limiting the present disclosure. Although the present disclosure has been described in detail with reference to the various embodiments described above, it should be understood by those skilled in the art that the technical solutions recited in the various embodiments described above can still be modified or a part or all of the technical features therein can be equivalently substituted. These modifications or substitutions, which are made without the essence of the corresponding technical solutions departing from the scope of the technical solutions of the various embodiments of the present disclosure, should be included in the scope of the claims and specification of the present disclosure.

We claim:

1. A shift register circuit, comprising:
    an input;
    a reset end;
    an output;
    an input module connected to a first node, a second node, and the input, configured to pull up a potential at the first node under the control of a signal at the input while releasing a noise voltage at the second node;
    an output module connected to the first node and the output, configured to pull up a potential at the output when the potential at the first node is at a high level;
    a pull-up module connected to the second node, configured to periodically pull up a potential at the second node by using current from a high-level bias voltage line under the control of a clock signal;
    a reset module connected to the first node, the second node and the reset end, configured to pull down the potential at the first node under the control of a signal at the reset end while releasing a noise voltage at the second node; and
    a pull-down module connected to the first node, the second node and the output, configured to continuously pull down the potential at the second node before the potential at the first node is pulled down, and pull down potentials at the first node and the output when the potential at the second node is at a high level.

2. The shift register circuit according to claim 1, wherein the input module comprises a first transistor and a second transistor, wherein,
    the first transistor has a gate connected to the input, one of a source and a drain connected to the input or a first bias voltage line, and the other of the source and the drain connected to the first node; and
    the second transistor has a gate connected to the input, one of a source and a drain connected to the second node, and the other of the source and the drain connected to a low-level bias voltage line.

3. The shift register circuit according to claim 1, wherein the reset module comprises a third transistor and a fourth transistor, wherein,
    the third transistor has a gate connected to the reset end, one of a source and a drain connected to the reset end or a second bias voltage line, and the other of the source and the drain connected to the first node; and
    the fourth transistor has a gate connected to the reset end, one of a source and a drain connected to the second node, and the other of the source and the drain connected to a low-level bias voltage line.

4. The shift register circuit according to claim 1, wherein the output module comprises a first capacitance and a fifth transistor, wherein,
    the fifth transistor has a gate connected to the first node, one of a source and a drain connected to a first clock signal line, and the other of the source and the drain connected to the output; and
    the first capacitance has a first end connected to the first node and a second end connected to the output.

5. The shift register circuit according to claim 4, wherein the first capacitance is formed of a gate metal layer and a source/drain metal layer which are overlapped with each other in the fifth transistor.

6. The shift register circuit according to claim 1, wherein the pull-up module comprises a sixth transistor and a seventh transistor, wherein,
    the sixth transistor has a gate connected to the high-level bias voltage line, one of a source and a drain connected to a second clock signal line, and the other of the source and the drain connected to a gate of the seventh transistor; and
    the seventh transistor has one of a source and a drain connected to the high-level bias voltage line, and the other of the source and the drain connected to the second node.

7. The shift register circuit according to claim 1, wherein the pull-up module comprises an eighth transistor, a ninth transistor, and a tenth transistor, wherein,
    the eighth transistor has a gate connected to a second clock signal line, one of a source and a drain connected to a first bias voltage line, and the other of the source and the drain connected to a gate of the tenth transistor;
    the ninth transistor has a gate connected to a third clock signal line, one of a source and a drain connected to the gate of the tenth transistor, and the other of the source and the drain connected to a second bias voltage line; and
    the tenth transistor has one of a source and a drain connected to the high-level bias voltage line, and the other of the source and the drain connected to the second node.

8. The shift register circuit according to claim 7, wherein the pull-up module further comprises an eleventh transistor connected between the tenth transistor and the second node, wherein the eleventh transistor has a gate connected to the high-level bias voltage line, one of a source and a drain connected to the tenth transistor, and the other of the source and the drain connected to the second node.

9. The shift register circuit according to claim 1, wherein the pull-down module comprises a second capacitance, a twelfth transistor, a thirteenth transistor, and a fourteenth transistor, wherein,
    the second capacitance has a first end connected to the second node, and a second end connected to a low-level bias voltage line;
    the twelfth transistor has a gate connected to the second node, one of a source and a drain connected to the first node, and the other of the source and the drain connected to the low-level bias voltage line;
    the thirteenth transistor has a gate connected to the second node, one of a source and a drain connected to the output, and the other of the source and the drain connected to the low-level bias voltage line; and
    the fourteenth transistor has a gate connected to the output, one of a source and a drain connected to the second node, and the other of the source and the drain connected to the low-level bias voltage line.

10. The shift register circuit according to claim 9, wherein the pull-down module further comprises a fifteenth transistor, wherein the fifteenth transistor has a gate connected to the first node, one of a source and a drain connected to the second node, and the other of the source and the drain connected to the low-level bias voltage line.

11. The shift register circuit according to claim 1, further comprising:
an isolation module between the input module and the first node and between the reset module and the first node, configured to isolate a noise voltage between the input and the first node and a noise voltage between the reset end and the first node.

12. The shift register circuit according to claim 11, wherein the isolation module comprises a sixteenth transistor, wherein the sixteenth transistor has a gate connected to the high-level bias voltage line, one of a source and a drain connected to the input module and the reset module, and the other of the source and the drain connected to the first node.

13. The shift register circuit according to claim 1, further comprising:
a voltage stabilization module connected to the output, configured to stabilize the potential at the output by using current from the high-level bias voltage line after the potential at the output is pulled up.

14. The shift register circuit according to claim 11, wherein the voltage stabilization module comprises a seventeenth transistor, wherein the seventeenth transistor has a gate connected to the output, one of a source and a drain connected to the high-level bias voltage line, and the other of the source and the drain connected to the output.

15. A method for driving the shift register circuit according to claim 1, comprising:

applying an input signal to the input in a first stage to enable the input module to pull up the potential at the first node and release the noise voltage at the second node, and enable the output module to pull up the potential at the output in a second stage in which the potential at the first node is at a high level; and applying a reset signal to the reset end in a third stage to enable the reset module to pull down the potential at the first node while releasing the noise voltage at the second node, and enable the pull-down module to pull down the potentials at the first node and the output when the potential at the second node is at a high level;

wherein the potential at the second node is periodically pulled up by the pull-up module by using the current from the high-level bias voltage line under the control of a clock signal; and the potential at the second node is pulled down continuously by the pull-down module before the potential at the first node is pulled down, to enable the potential at the second node to be maintained at a low level before the potential at the first node is pulled down.

16. A gate driving circuit, comprising multiple shift register units each having a circuit structure of the shift register circuit according to claim 1.

17. A display apparatus, comprising the gate driving circuit according to claim 16.

* * * * *